United States Patent
Nathawad

(10) Patent No.: US 7,728,631 B2
(45) Date of Patent: Jun. 1, 2010

(54) PHASE FREQUENCY DETECTOR WITH PULSE WIDTH CONTROL CIRCUITRY

(75) Inventor: Lalitkumar Nathawad, Costa Mesa, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 0 days.

(21) Appl. No.: 12/120,827

(22) Filed: May 15, 2008

(65) Prior Publication Data

US 2009/0285279 A1 Nov. 19, 2009

(51) Int. Cl.
*H03D 13/00* (2006.01)
(52) U.S. Cl. .................................. 327/12; 327/3; 327/7
(58) Field of Classification Search ..................... 327/2, 327/3, 7, 8, 12, 39, 40, 42, 43, 47, 49
See application file for complete search history.

(56) References Cited

U.S. PATENT DOCUMENTS

| | | | | |
|---|---|---|---|---|
| 4,904,948 A * | 2/1990 | Asami | ........................... | 327/12 |
| 5,936,430 A * | 8/1999 | Patterson | ...................... | 327/12 |
| 6,002,273 A * | 12/1999 | Humphreys | .................... | 327/3 |
| 6,285,225 B1 * | 9/2001 | Chu et al. | .................... | 327/158 |
| 6,326,859 B1 | 12/2001 | Goldman et al. | | |
| 6,404,240 B1 * | 6/2002 | Hakkal et al. | .................. | 327/12 |
| 6,404,289 B1 | 6/2002 | Su et al. | | |
| 6,496,075 B2 | 12/2002 | Justice et al. | | |
| 6,556,093 B2 | 4/2003 | Craninckx et al. | | |
| 6,570,453 B2 | 5/2003 | Su et al. | | |
| 6,683,478 B2 * | 1/2004 | Yoo | ............................. | 327/12 |
| 6,731,176 B2 | 5/2004 | Su et al. | | |
| 7,075,383 B2 * | 7/2006 | Adachi et al. | ................ | 332/127 |
| 7,375,557 B2 * | 5/2008 | Cho | ............................... | 327/3 |
| 2006/0145771 A1 | 7/2006 | Strange | | |
| 2006/0238265 A1 | 10/2006 | Soltanian et al. | | |

OTHER PUBLICATIONS

"U.S. Appl. No. 12/112,914 Office Action", filed Jul. 2, 2009, 10 pages.

* cited by examiner

*Primary Examiner*—Hai L Nguyen
(74) *Attorney, Agent, or Firm*—DeLizio Gilliam, PLLC

(57) ABSTRACT

A phase frequency detector comprising a detection circuit and a reset circuit. The phase frequency detector may receive a feedback signal having a predetermined pulse width. The detection circuit may generate a first control signal based on a reference signal, and a second control signal based on the feedback signal. The reset circuit may generate a reset signal used for resetting the detection circuit based on the first control signal, the second control signal, and the feedback signal. The feedback signal may be tied to the generation of the reset signal such that, during a locked state, the pulse width of the second control signal is approximately equal to the pulse width of the feedback signal, which helps reduce the sensitivity of the circuit to nonlinearities.

16 Claims, 7 Drawing Sheets

PHASE FREQUENCY DETECTOR WITH PULSE WIDTH CONTROL CIRCUITRY

TECHNICAL FIELD

Embodiments of the inventive subject matter generally relate to the field of integrated circuits, and, more particularly, to phase frequency detectors.

BACKGROUND

A phase frequency detector (PFD) is an electronic circuit that compares the phase and frequency of a first signal to that of a reference signal. Based on the comparison, the PFD generates one or more control signals. In phase-locked loop (PLL) implementations, the PFD generates the one or more control signals to control a charge pump. The charge pump is used to generate a control voltage for controlling the frequency of oscillation of a voltage-controlled oscillator (VCO). In some PLL designs, e.g., fractional-N PLLs, charge pump nonlinearities arising from mismatched charge pump currents introduce a significant amount of phase noise in the loop, which degrades the PLL performance.

SUMMARY

Various embodiments are disclosed of a phase frequency detector with pulse width control circuitry. According to one embodiment, the phase frequency detector comprises a detection circuit and a reset circuit. The detection circuit is operable to receive a reference signal and a feedback signal. Furthermore, the detection circuit is operable to generate a first control signal based, at least in part, on the reference signal, and generate a second control signal based, at least in part, on the feedback signal. The reset circuit is operable to generate a reset signal based, at least in part, on the first control signal, the second control signal, and the feedback signal. Additionally, the reset circuit is operable to provide the reset signal to the detection circuit to reset the detection circuit.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

The description that follows includes exemplary circuits, systems, and methods that embody techniques of the present inventive subject matter. However, it is understood that the described embodiments may be practiced without these specific details. For instance, although examples refer to tying the pulse width of a control signal generated by a phase frequency detector with the pulse width of a feedback signal to improve system performance, in other embodiments, the pulse width of a different control signal generated by a phase frequency detector can be tied with the pulse width of a reference signal. In other instances, well-known structures and techniques have not been shown in detail in order not to obfuscate the description.

In various embodiments, a phase frequency detector includes circuitry for controlling the pulse widths of one or more phase frequency detector signals to reduce in-band phase noise in a fractional-N PLL due to charge pump nonlinearities and improve PLL performance. In one example, the phase frequency detector receives a feedback signal having a pulse width that is approximately equal to a predetermined number of VCO cycles to accommodate a maximum possible timing skew between reference and feedback signals. A detection circuit generates a first control signal based on the transitions of the reference signal, and a second control signal based on the transitions of the feedback signal. A reset circuit generates a reset signal used for resetting the detection circuit based on the transitions of the first control signal, the second control signal, and the feedback signal. The reset circuit includes pulse extension circuitry that ties the feedback signal to the generation of the reset signal such that, during a locked state, the pulse width of the second control signal is approximately equal to the pulse width of the feedback signal, which helps reduce the sensitivity of the PLL to charge pump nonlinearities arising from mismatched charge pump currents.

Figure 1:
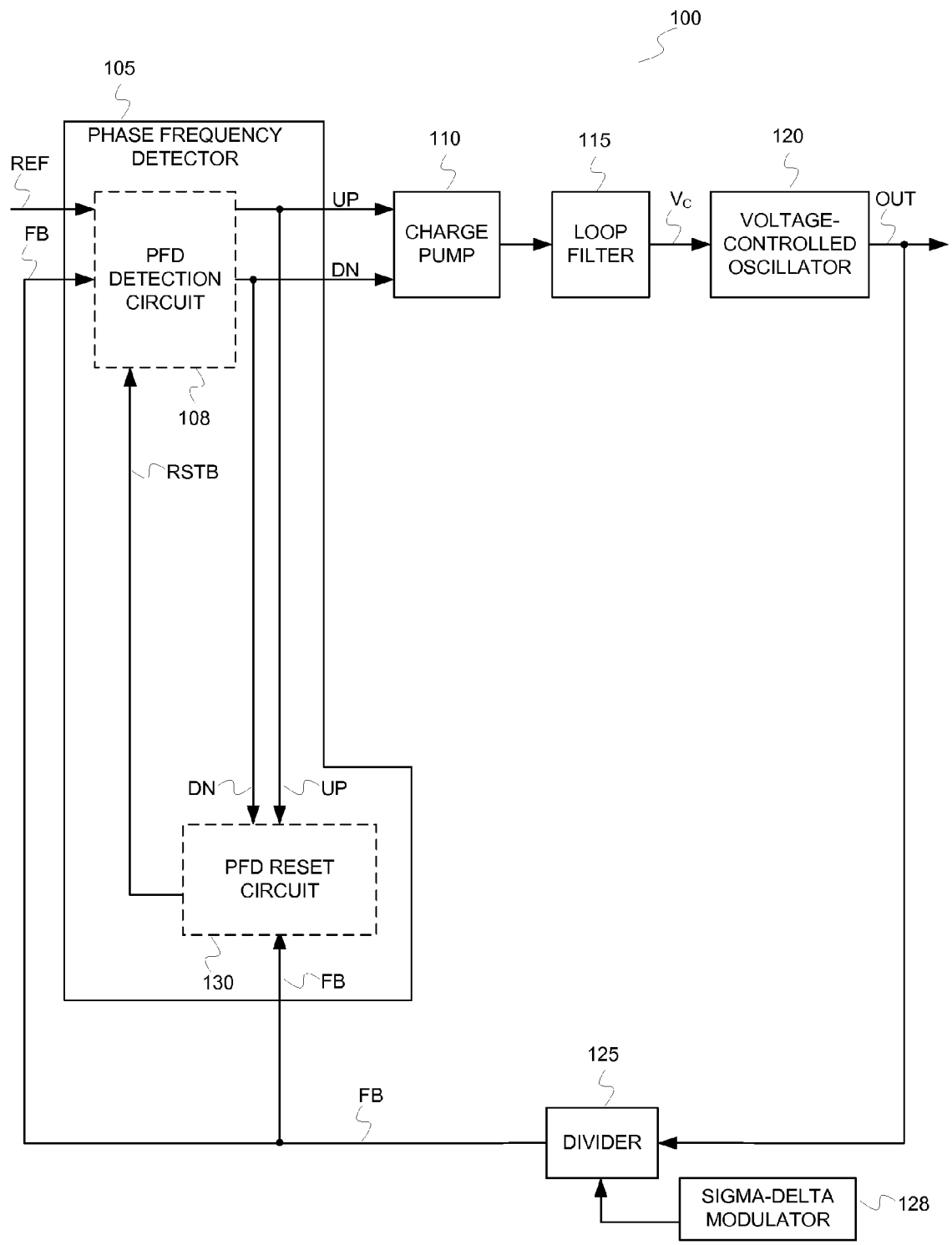
FIG. 1 is a block diagram of one embodiment of a fractional-N PLL.

FIG. 1 is a block diagram of one embodiment of a fractional-N phase-locked loop (PLL) 100. As illustrated, the PLL 100 includes a phase frequency detector (PFD) 105, a charge pump 110, a loop filter 115, a voltage-controlled oscillator (VCO) 120, a divider 125, and a sigma-delta modulator 128. The PLL 100 synchronizes an output signal (OUT) generated by the VCO 120 at the output terminal of the PLL with a reference signal (REF) received at one of the input terminals of the PLL with respect to frequency and phase. The output signal of the PLL 100 is first processed within the feedback loop of the PLL to generate a feedback signal (FB). The PLL 100 can then compare the frequency and phase difference between the reference signal and the feedback signal to determine whether to adjust the output signal of the PLL 100 to achieve or maintain a specific phase and frequency relationship between the output signal and the reference signal, i.e., a locked state.

As illustrated, the PDF 105 includes a PFD detection circuit 108 and a PFD reset circuit 130. During operation, the PFD detection circuit 108 receives the feedback and reference signals and detects transitions in the feedback and reference signals. Based on the signal transitions, the PFD detection circuit 108 provides one or more control signals (e.g., the UP and DN signals) to the charge pump 100. Specifically, in some implementations, the PFD detection circuit 108 generates a first control signal (e.g., the UP signal) based on the transitions of the reference signal, and generates a second control voltage (e.g., the DN signal) based on the transitions of the feedback signal. Furthermore, the PFD reset circuit 130 generates a reset signal (RSTB) used to reset the PFD detection circuit 108 based on the UP, DN, and feedback signals, as will be further described below with reference to FIGS. 2-7. It is noted, however, that in other embodiments the PFD reset circuit 130 can be designed to generate the reset signal used to reset the PFD detection circuit 108 based on the reference signal instead of the feedback signal.

The charge pump 100 generates a charge pump current based on the UP and DN signals from the phase frequency detector 105. The loop filter 115 (e.g., a low-pass filter) generates a control voltage $V_c$ based on the charge pump current and provides the control voltage $V_c$ to the VCO 120. The VCO 120 adjusts (or maintains) the frequency of oscillation of the output signal based on the control voltage $V_c$. The divider 125 and the sigma-delta modulator 128 in the feedback path of the PLL 100 generate the feedback signal based on a desired (e.g., programmable) relationship between the output signal and the reference signal. Specifically, since the PLL 100 is a fractional-N PLL, in a locked state, the output signal of the PLL can be a predefined non-integer or integer multiple of the reference signal.

It should be noted that the components described with reference to FIG. 1 are meant to be exemplary only, and are not intended to limit the invention to any specific set of components or configurations. For example, in various embodiments, one or more of the components described may be omitted, combined, modified, or additional components included, as desired. For instance, in some embodiments, the PLL 100 may be another type of PLL or may have a different configuration. In some embodiments, the feedback path of the PLL 100 may include additional circuitry, or may include a different type of modulator 128. In other embodiments, the PLL 100 can include pulse control circuitry to generate a feedback signal having a pulse width that is approximately equal to a predetermined number of VCO cycles, as will be further described below with reference to FIG. 3.

Figure 2:
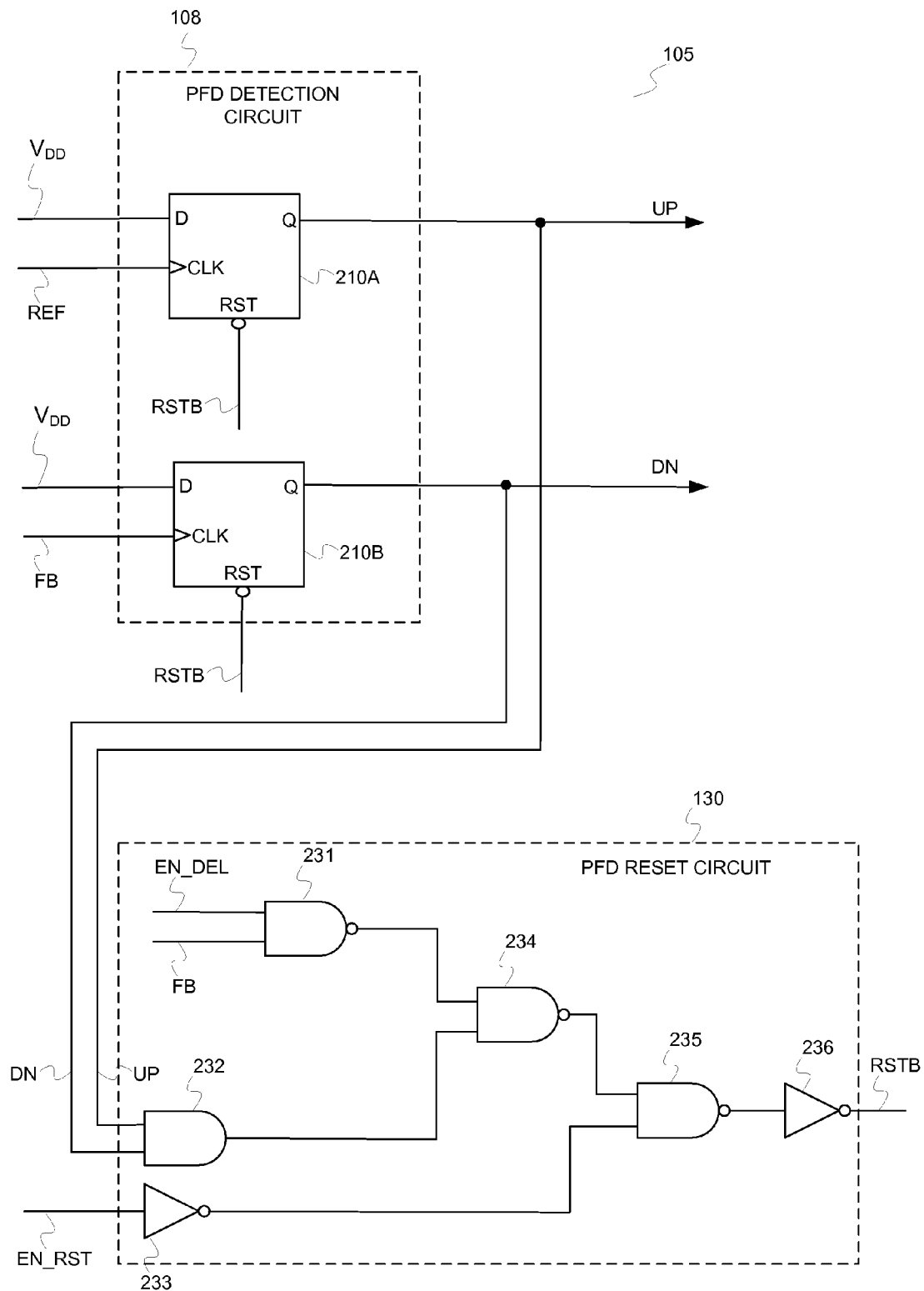
FIG. 2 is a circuit diagram of one embodiment of a PFD with pulse width control circuitry.

FIG. 2 is a circuit diagram of one embodiment of a PFD 105 with pulse width control circuitry. As illustrated, the PFD 105 comprises a PFD detection circuit 108 and a PFD reset circuit 130. In this specific implementation, the PFD detection circuit 108 includes flip-flops 210A and 210B (hereinafter "flip-flops 210"), and the PFD reset circuit 130 includes a NAND gate 231, an AND gate 232, an inverter 233, a NAND gate 234, a NAND gate 235, and an inverter 236.

During operation, the PFD detection circuit 108 receives a supply voltage ($V_{DD}$), a reference signal (REF), and a feedback signal (FB). Specifically, the supply voltage is received at each of the D terminals of the flip-flops 210A and 210B, the reference signal is received at the clock terminal of the flip-flop 210A, and the feedback signal is received at the clock terminal of the flip-flop 201B. In response to detecting a transition of the reference signal from a first state to a second state (e.g., a rising edge), the flip-flop 210A changes the state of the first control signal from a first (disabled) state to a second (enabled) state. For example, the flip-flop 210A generates a rising edge of the first control signal. Likewise, in response to detecting a transition of the feedback signal from a first state to a second state (e.g., a rising edge), the flip-flop 210B changes the state of the second control signal from a first (disabled) state to a second (enabled) state. For example, the flip-flop 210B generates a rising edge of the second control signal. In other words, the flip-flops 210 generate the control signals based on the transitions of the reference and feedback signals, and the value of the supply voltage provided to the D terminals of the flip-flops 210.

It is noted that in some embodiments the PFD detection circuit 108 may include flip-flops that are triggered by the falling edges of the reference and feedback signals, rather than the rising edges. It is further noted that in other embodiments the PFD detection circuit 108 can include different circuit components, e.g., other types of clocked devices, for generating the control signals, and/or can include additional circuitry, e.g., for buffering the UP and DN control signals.

The PFD reset circuit 130 receives the control signals (e.g., the UP and DN signals) from the PFD detection circuit 108, the feedback signal, a reset enable (EN_RST) signal, and a delay enable (EN_DEL) signal. The delay enable signal turns on or off the UP/DN pulse extension feature, which ties the pulse width of the DN signal with the pulse width of the feedback signal, as will be further described below. The reset enable signal is used to reset the PFD 105 to a known initial state. When the reset enable signal is high, an enabled reset signal (RSTB) is generated to reset the PFD detection circuit. When the reset enable signal is low, the state of the reset signal is dependent on the rest of the input signals of the PFD 105. In the example shown in FIG. 2, assuming the reset enable signal is low and the enable delay signal is high, the PFD reset circuit 130 generates an enabled reset signal used for resetting the flip-flops 210 based on the transitions of the UP signal, the DN signal, and the feedback signal. Specifically, the PFD reset circuit 130 changes the state of the reset signal from a first (disabled) state to a second (enabled) state in response to the first control signal (e.g., the UP signal) transitioning from the first state to the second state, the second control signal (e.g., the DN signal) transitioning from the first state to the second state, and the feedback signal transitioning from the second state to the first state. It is noted that for some signals, e.g., the UP, DN, and feedback signals, the enabled state is when the signal is high, and for other signals, e.g., the reset signal, the enabled state is when the signal is low. It is further noted, however, that in other implementations the PFD reset circuit may be designed such that the enabled state for one or more of the signals can be different, e.g., the enabled state for the reset signal may be when the reset signal is high.

In PLL implementations, when the PLL is in a locked state, the UP and DN signals transition to an enabled state (e.g., high) before the feedback signal transitions to a disabled state (e.g., low). The rising edge of the feedback signal triggers the rising edge of the DN signal. The falling edge of the feedback signal (in addition to the rising edges of the UP and DN signals) enables the reset signal. The reset signal triggers the falling edge of the DN signal. Therefore, based on the design of the PFD reset circuit 130 which ties the feedback signal to the generation of the reset signal, during a locked state, the pulse width of the DN signal, $t_{pw,dn}$, is approximately equal to the pulse width of the feedback signal, $t_{pw,fb}$, when the PLL is in a locked state (e.g., see timing diagrams of FIGS. 4-5). The pulse width of the UP signal, $t_{pw,up}$, is equal to $t_{pw,dn}+(t_{r,ref}-t_{r,fb})$, where $(t_{r,ref}-t_{r,fb})$ is the difference between the rising edges of the reference and feedback signals. In one implementation, the pulse width of the DN signal being approximately equal to the pulse width of the feedback signal is defined to mean that the pulse widths vary by no more than 5%. In another implementation, the pulse width of the DN signal being approximately equal to the pulse width of the feedback signal is defined to mean that the pulse widths vary by no more than 10%. It is noted, however, that in other implementations, the definition of "approximately equal" may be more strict, e.g., within 3%, or more relaxed, e.g., within 12%.

The PFD reset circuit 130 helps the PFD 105 to substantially reduce charge pump nonlinearity due to mismatch in the currents generated by the charge pump based on the UP and DN signals. In PLLs having sigma-delta modulators, e.g., fractional-N PLLs, the charge pump nonlinearity can contribute a large amount of in-band phase noise when the feedback signal is sigma-delta modulated. Since the DN signal is relatively constant over time, having a pulse width that is approximately equal to the pulse width of the feedback signal, and the UP signal is modulated in a substantially linear fashion with respect to the time difference between the rising edges of the reference and feedback signals, the PLL 100 may be less sensitive to a mismatch in the charge pump currents than other designs. In other words, despite any mismatch in the charge pump currents, the net charge transferred to the loop filter of the PLL each cycle remains approximately a linear function of the time (phase) difference between the rising edges of the reference and feedback signals.

Figure 3:
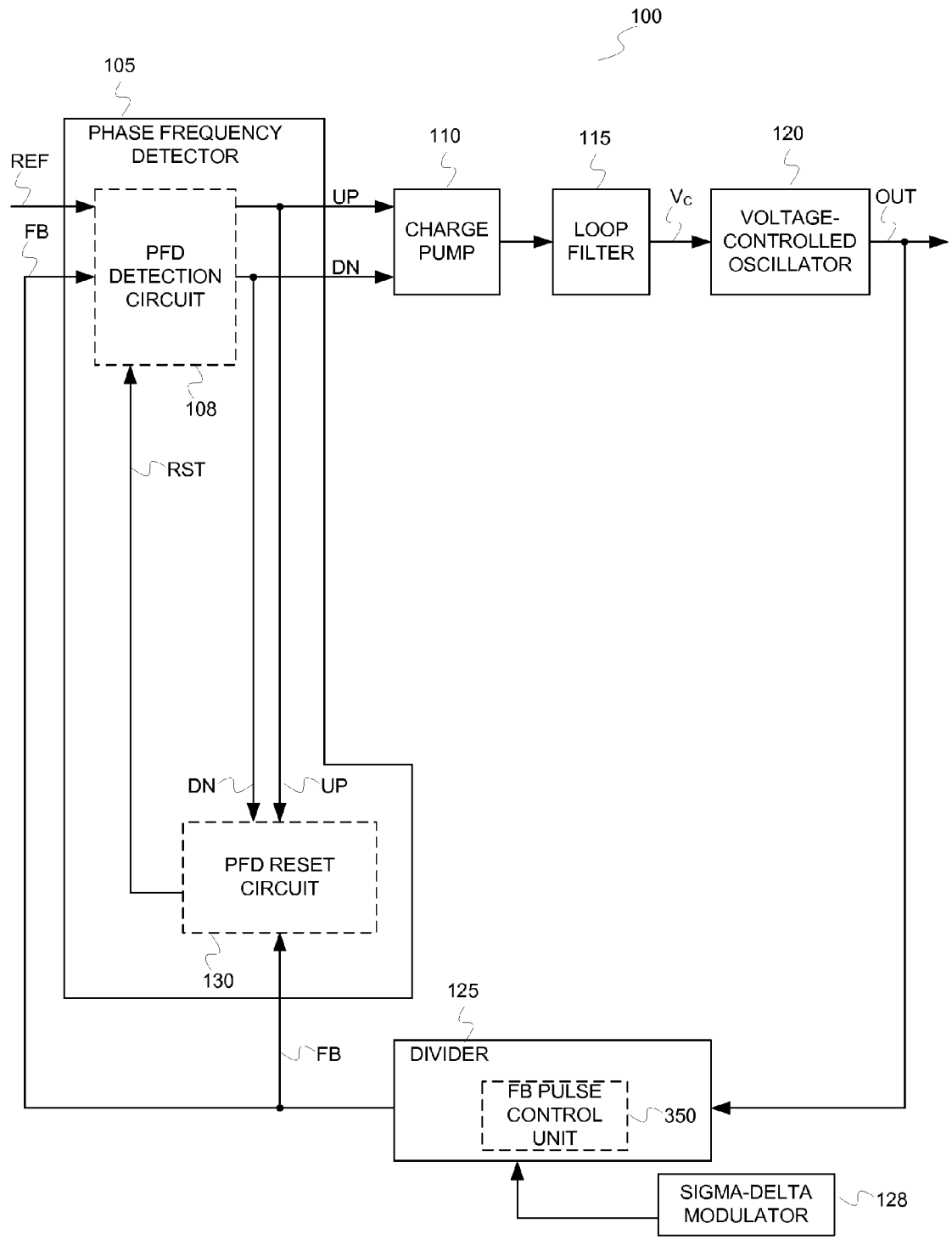
FIG. 3 is a block diagram of one embodiment of a fractional-N PLL with a feedback pulse control unit.

FIG. 3 is a block diagram of one example of the PLL 100 shown on FIG. 1 with a feedback (FB) pulse control unit 350. In this embodiment, the divider 125 of the PLL 100 includes the feedback pulse control unit 350 for generating a feedback signal having a predetermined pulse width. Since the pulse width of the DN signal is tied to the pulse width of the feedback signal, the pulse width of the generated DN signal is also approximately equal to the predetermined pulse width. In order to generate a DN signal having a pulse width that is approximately equal to the pulse width of the feedback signal during a locked state, the pulse width of the feedback signal is generated with a predetermined pulse width to accommodate the maximum possible timing skew between the reference and feedback signals introduced by the sigma-delta modulator 128 in a locked state. For example, the pulse width of the feedback signal may be set to approximately equal four VCO cycles so that the pulse width of the feedback signal is greater than the maximum expected delay between the reference and feedback signals introduced by a $3^{rd}$ order sigma-delta modulator.

As illustrated, the divider 125 provides the feedback signal to the PFD detection circuit 108 and the PFD reset circuit 130. The divider 125 is tied to the VCO 120 to accurately generate a feedback signal having a pulse width that approximately equals a predetermined number of VCO cycles. The feedback pulse control unit 350 may be implemented within divider 125 using hardware and/or software. It is noted, however, that in other embodiments the pulse width of the feedback pulse may be generated to equal a predetermined number of VCO cycles by other mechanisms. Although FIG. 3 shows the feedback pulse control unit 350 as part of the divider 125, it is noted that in some embodiments the feedback pulse control unit 350 may be separate from the divider 125 and/or may be included within other components of the PLL.

In one embodiment, as shown in FIG. 2, the output terminal of NAND gate 231 is coupled to a first input terminal of the NAND gate 234, a first input terminal of the NAND gate 231 receives an enable delay signal, and a second input terminal of NAND gate 231 receives the feedback signal. The output terminal of AND gate 232 is coupled to a second input terminal of NAND gate 234, a first input terminal of the AND gate 232 receives the UP signal, and a second input terminal of the AND gate 232 receives the DN signal. The output terminal of the NAND gate 234 is coupled to a first input terminal of the NAND gate 235, and the output terminal of inverter 233 is coupled to a second input terminal of the NAND gate 235. The input terminal of the inverter 233 receives the enable reset signal. The output terminal of NAND gate 235 is coupled to the input terminal of the inverter 236. The output terminal of the inverter 236 is coupled to the reset terminals of the flip-flops 210. It is noted, however, that in other embodiments the PFD reset circuit 130 can be implemented using various other combinations of logic gates and/or other circuit components.

It should be noted that the components described with reference to FIG. 2 are meant to be exemplary only, and are not intended to limit the invention to any specific set of components or configurations. For example, in various embodiments, one or more of the components described may be omitted, combined, modified, or additional components included, as desired. For instance, in some embodiments, the PFD detection circuit 108 can be implemented using other circuitry, e.g., other types of clocked devices. Also, in some embodiments, PFD detection circuit 108 can include additional circuitry after the flip-flops 210, e.g., to buffer the UP and DN signals. Furthermore, in other embodiments, the PFD reset circuit 130 can be implemented using hardware and/or software.

Figure 4:
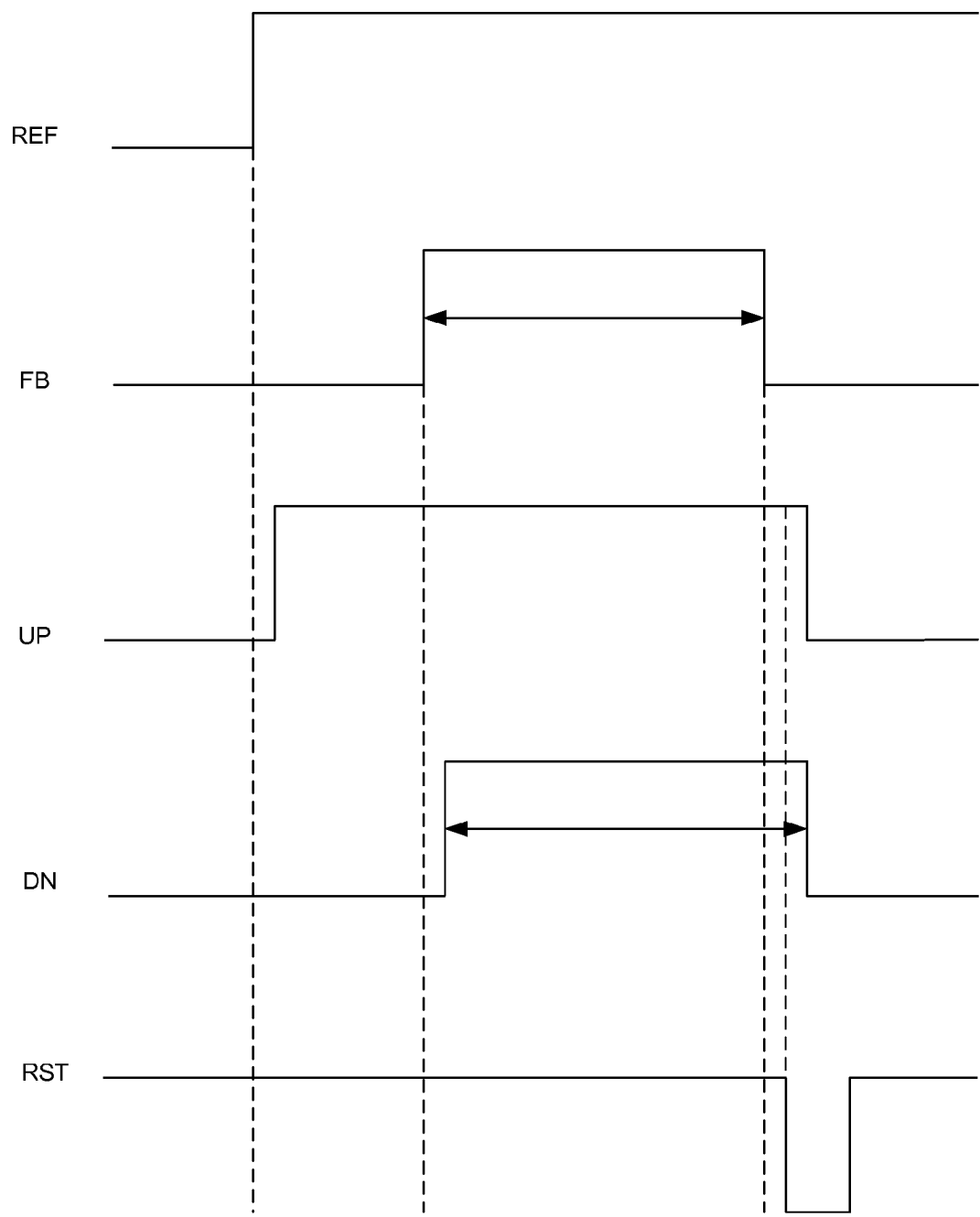
FIG. 4 is a timing diagram of one example of a process for generation of a reset signal when the reference signal is ahead of the feedback signal.

FIG. 4 is a timing diagram of one example of a process for generation of a reset signal when the reference signal is ahead of the feedback signal. As illustrated, a transition in the reference signal from low to high (e.g., a rising edge) triggers a transition in UP signal from low to high. A transition in the feedback signal from low to high triggers a transition in the DN signal from low to high. The reset signal transitions from a high state to a low state in response to the UP and DN signals transitioning from a low state to a high state and the feedback signal transitioning from a high state to a low state. As shown in FIG. 4, the signals transition from one state to another after a fixed propagation delay (e.g., flip-flop delay or logic gate delay).

Figure 5:
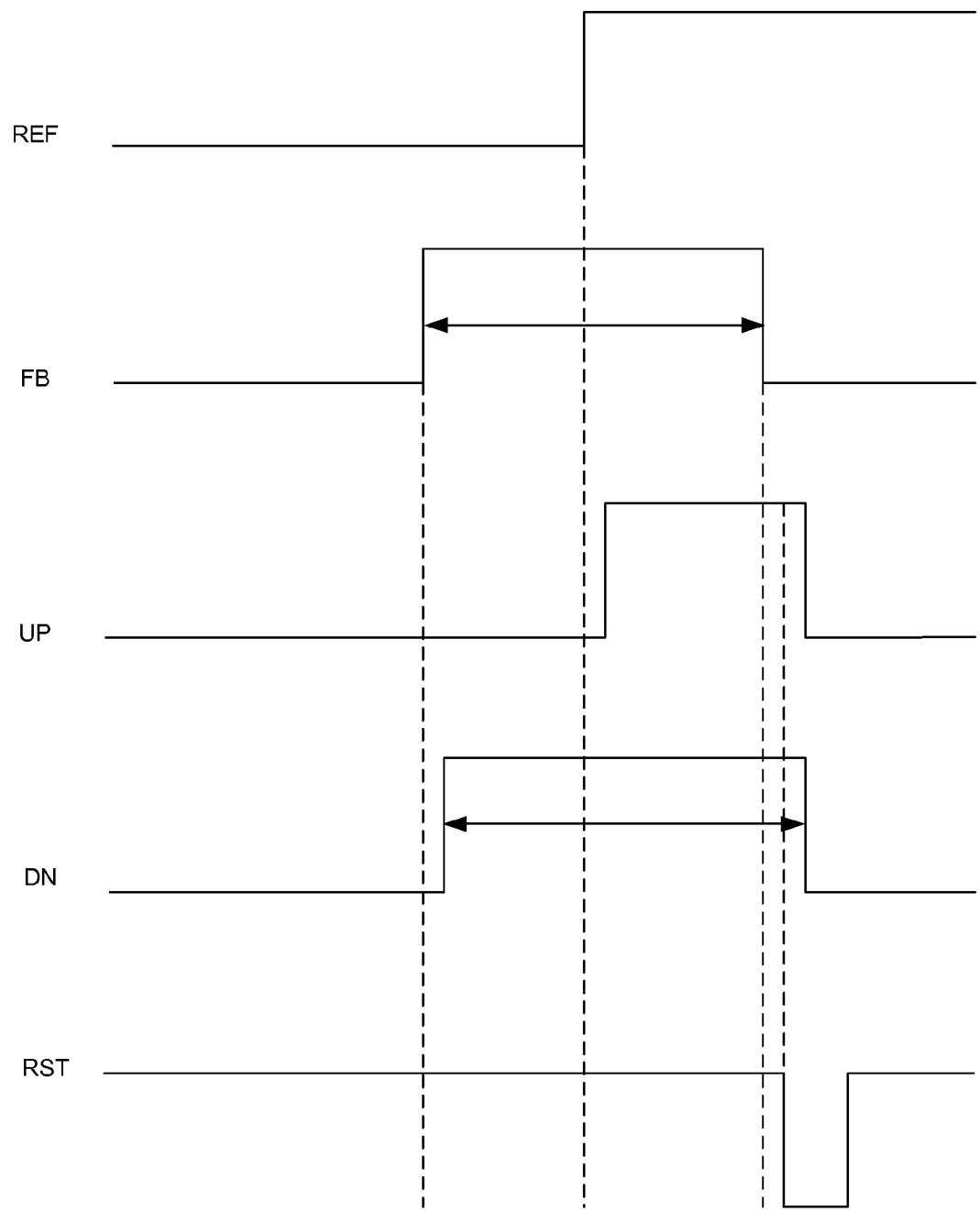
FIG. 5 is a timing diagram of one example of a process for the generation of a reset signal when the feedback signal is ahead of the reference signal.

FIG. 5 is a timing diagram of one example of a process for the generation of a reset signal when the feedback signal is ahead of the reference signal. As illustrated, a transition in the feedback signal from low to high triggers a transition in the DN signal from low to high. A transition in the reference signal from low to high triggers a transition in UP signal from low to high. The reset signal transitions from a high state to a low state in response to the UP and DN signals transitioning from a low state to a high state and the feedback signal transitioning from a high state to a low state. Similar to FIG. 4, the signals shown in FIG. 5 transition from one state to another after a fixed propagation delay (e.g., flip-flop delay or logic gate delay).

In FIGS. 4 and 5, as noted above, since the rising edge of the feedback signal triggers the rising edge of the DN signal, and the falling edge of the feedback signal (in addition to the rising edges of the UP and DN signals) enables the reset signal, which triggers the falling edge of the DN signal, then the pulse width of the DN signal is approximately equal to the pulse width of the feedback signal when the PLL is in a locked state. This makes the PLL circuitry less sensitive to a mismatch in the charge pump currents. In order to generate a DN signal having a pulse width that is approximately equal to the pulse width of the feedback signal when the PLL is in a locked state, the pulse width of the feedback signal is set to approximately equal a predetermined number of VCO cycles (e.g., four VCO cycles) to accommodate the maximum possible timing skew between the reference and feedback signals introduced by the sigma-delta modulator 128.

Figure 6:
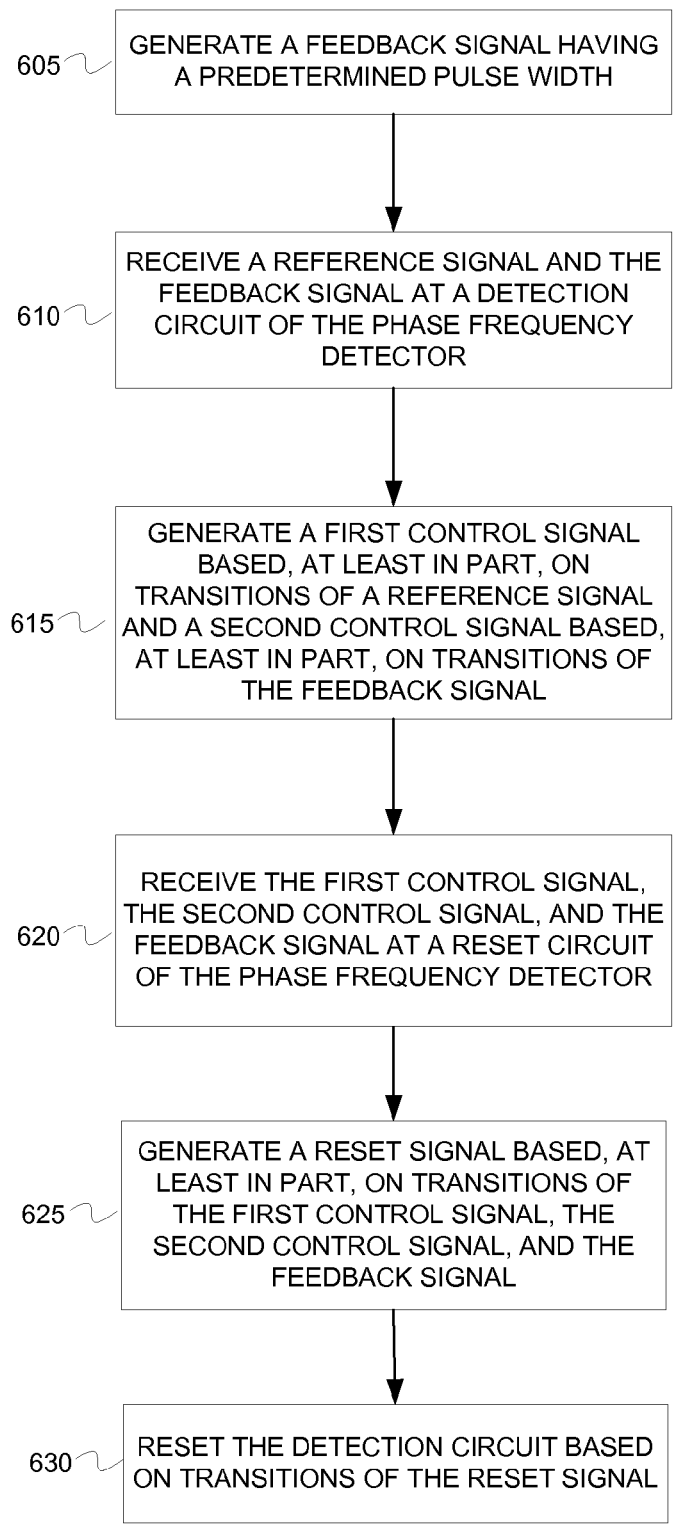
FIG. 6 is a flow diagram of a method for controlling the pulse widths of one or more phase frequency detector signals to reduce in-band phase noise in a fractional-N PLL due to charge pump nonlinearities and improve PLL performance.

FIG. 6 is a flow diagram of a method for controlling the pulse widths of one or more phase frequency detector signals to reduce in-band phase noise in a fractional-N PLL due to charge pump nonlinearities and improve PLL performance. At block 605, a feedback signal is generated having a predetermined pulse width. Specifically, the pulse width of the feedback signal may be set to approximately equal a predetermined number of VCO cycles to accommodate the maximum possible timing skew between the reference and feedback signals introduced by a sigma-delta modulator. At block 610, the reference signal and the feedback signal are received at the detection circuit 108 of the PFD 105. At block 615, the first control signal is generated based on the transitions of the reference signal, and the second control signal is generated based on the transitions of the feedback signal.

At block 620, the first control signal, the second control signal, and the feedback signal are received at the reset circuit 130 of PFD 105. At block 625, the reset signal is generated based on the transitions of the first control signal, the second control signal, and the feedback signal. As described above, the feedback signal is tied to the generation of the reset signal such that the pulse width of the second control signal is approximately equal to the pulse width of the feedback signal. At block 630, the detection circuit is reset based on the transitions of the reset signal.

It should be understood that the depicted flow diagrams are examples meant to aid in understanding embodiments and should not be used to limit embodiments or limit scope of the claims. Embodiments may perform additional operations, fewer operations, operations in a different order, operations in parallel, and some operations differently. For instance, referring to FIG. 6, in some embodiments the reset signal can be generated based on the first control signal, the second control signal, and the reference signal.

Figure 7:
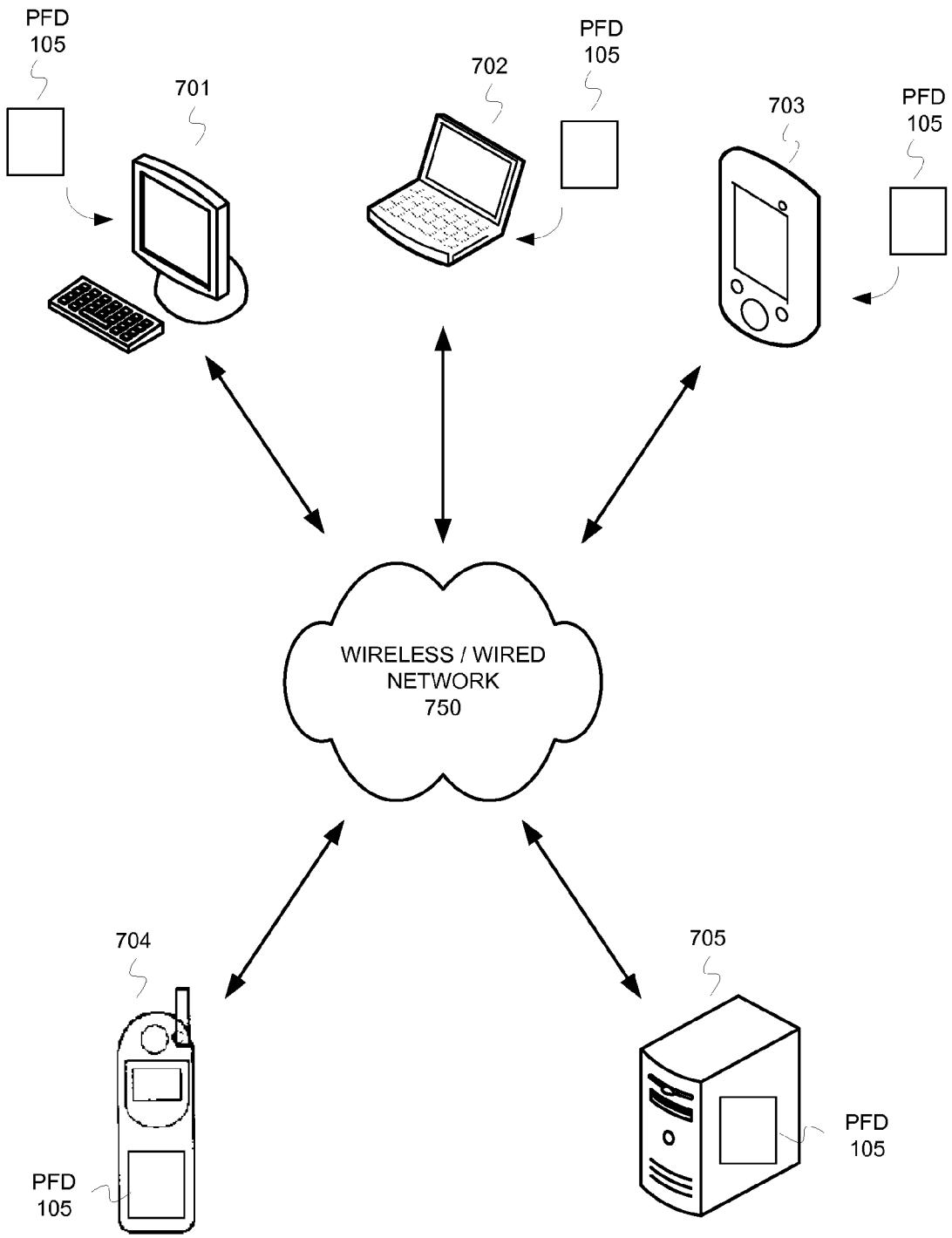
FIG. 7 is a block diagram of one embodiment of a communication system.

FIG. 7 is a block diagram of one embodiment of a communication system. As illustrated, the communication system may include a plurality of communication devices, such as personal computer (PC) 701, laptop 702, global positioning system (GPS) device 703, mobile phone 704, and server 705, transmitting and receiving information via a wireless and/or wired communication network 750. In various implementations, the communication devices comprise a transceiver having a PFD (e.g., PFD 105 of FIG. 2) operable to implement at least some of the operations and features described above with reference to FIGS. 1-6, such as controlling the pulse widths of one or more phase frequency detector signals to improve system performance. It is noted, however, that in other embodiments the communication system may include other types of communication devices.

While the embodiments are described with reference to various implementations and exploitations, it will be understood that these embodiments are illustrative and that the scope of the inventive subject matter is not limited to them. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A phase frequency detector comprising:
    a detection circuit operable to receive a reference signal and a feedback signal, wherein the detection circuit is operable to generate a first control signal based, at least in part, on the reference signal, and generate a second control signal based, at least in part, on the feedback signal, wherein the detection circuit is operable to change a state of the first control signal from a first state to a second state in response to the reference signal transitioning from a first state to a second state, and change a state of the second control signal from a first state to a second state in response to the feedback signal transitioning from a first state to a second state; and
    a reset circuit operable to generate a reset signal based, at least in part, on the first control signal, the second control signal, and the feedback signal, wherein the reset circuit is operable to change a state of the reset signal from a first state to a second state in response to the first control signal transitioning from the first state to the second state, the second control signal transitioning from the first state to the second state, and the feedback signal transitioning from the second state to the first state, wherein the reset circuit is operable to provide the reset signal to the detection circuit to reset the detection circuit.

2. The phase frequency detector of claim 1, wherein the reset circuit is operable to enable the reset signal in response to receiving an enabled first control signal, an enabled second control signal, and a disabled feedback signal.

3. The phase frequency detector of claim 1, wherein the detection circuit includes a first clocked device and a second clocked device, wherein the first clocked device is operable to receive the reference signal and generate the first control signal based on transitions of the reference signal, and the second clocked device is operable to receive the feedback signal and generate the second control signal based on transitions of the feedback signal, wherein the reset circuit is operable to generate the reset signal based on transitions of the first control signal, the second control signal, and the feedback signal, wherein the reset circuit is operable to provide the reset signal to the first and second clocked devices to reset the first and second clocked devices.

4. The phase frequency detector of claim 1, wherein the reset circuit includes a first NAND gate, a second NAND gate, a third NAND gate, a first AND gate, a first inverter, and a second inverter, wherein the feedback signal is provided to a first input terminal of the first NAND gate, an enable delay signal is provided to a second input terminal of the first NAND gate, and an output terminal of the first NAND gate is coupled to a first input terminal of the second NAND gate, wherein the first control signal is provide to a first input terminal of the first AND gate, the second control signal is provided to a second input terminal of the first AND gate, and an output terminal of the first AND gate is coupled to a second input terminal of the second NAND gate, wherein an enable reset signal is provided to an input terminal of the first inverter, wherein an output terminal of the second NAND gate is coupled to a first input terminal of the third NAND gate and an output terminal of the first inverter is coupled to the second input terminal of the third NAND gate, wherein an output terminal of the third NAND gate is coupled to an input terminal of the second inverter, and an output terminal of the second inverter provides the reset signal to the detection circuit.

5. The phase frequency detector of claim 1, operable to receive the feedback signal having a predetermined pulse width that is greater than a maximum expected delay between the reference and feedback signals.

6. The phase frequency detector of claim 5, coupled to a divider and a voltage-controlled oscillator (VCO) of a fractional-N phase-locked loop (PLL), wherein the pulse width of the received feedback signal generated by the divider is approximately equal to a predetermined number of VCO cycles.

7. A method comprising:
receiving a reference signal and a feedback signal at a detection circuit of a phase frequency detector;
generating a first control signal based, at least in part, on a transition of the reference signal, wherein said generating the first control signal includes changing a state of the first control signal from a first state to a second state in response to the reference signal transitioning from a first state to a second state;
generating a second control signal based, at least in part, on a transition of the feedback signal, wherein said generating the second control signal includes changing a state of the second control signal from a first state to a second state in response to the feedback signal transitioning from a first state to a second state;
receiving the first control signal, the second control signal, and the feedback signal at a reset circuit of the phase frequency detector;
generating a reset signal based, at least in part, on transitions of the first control signal, the second control signal, and the feedback signal, wherein said generating the reset signal includes changing a state of the reset signal from a first state to a second state in response to the first control signal transitioning from the first state to the second state, the second control signal transitioning from the first state to the second state, and the feedback signal transitioning from the second state to the first state; and
resetting the detection circuit in response to said generation of the reset signal wherein said resetting the detection circuit includes changing the state of the first control signal from the second state to the first state and changing the state of the second control signal from the second state to the first state.

8. The method of claim 7, further comprising generating the feedback signal having a predetermined pulse width that is greater than a maximum expected delay between the reference and feedback signals.

9. A phase-locked loop (PLL) comprising:
a voltage-controlled oscillator (VCO) operable to generate an output signal of the PLL, wherein the output signal is associated with a feedback signal of the PLL;
a divider coupled to the VCO, wherein the divider is operable to receive the output signal and generate a feedback signal having a pulse width that is approximately equal to a predetermined number of VCO cycles; and
a phase frequency detector coupled to the divider, the phase frequency detector comprising a detection circuit and a reset circuit;
wherein the detection circuit is operable to receive a reference signal and the feedback signal, wherein the detection circuit is operable to generate a first control signal based, at least in part, on the reference signal, and generate a second control signal based, at least in part, on the feedback signal, wherein the detection circuit is operable to change a state of the first control signal from a first state to a second state in response to the reference signal transitioning from a first state to a second state, and change a state of the second control signal from a first state to a second state in response to the feedback signal transitioning from a first state to a second state;
wherein the reset circuit is operable to generate a reset signal based, at least in part, on the first control signal, the second control signal, and the feedback signal, wherein the reset circuit is operable to change a state of the reset signal from a first state to a second state in response to the first control signal transitioning from the first state to the second state, the second control signal transitioning from the first state to the second state, and the feedback signal transitioning from the second state to the first state, wherein the reset circuit is operable to provide the reset signal to the detection circuit to reset the detection circuit.

10. The PLL of claim 9, further comprising:
a charge pump coupled to the phase frequency detector, the charge pump operable to receive the first and second control signals from the detection circuit of the phase frequency detector and generate a charge pump current based, at least in part, on the first and second control signals; and
a loop filter coupled to the charge pump, the loop filter operable to generate a control voltage and provide the control voltage to the VCO to generate the output signal of the PLL.

11. The PLL of claim 9, further comprising a third order sigma-delta modulator coupled to the divider and operable to sigma-delta modulate the feedback signal, wherein the divider is operable to generate the feedback signal having a pulse width that is approximately equal to four VCO cycles to accommodate a maximum timing skew between the reference and feedback signals introduced by the third order sigma-delta modulator.

12. The PLL of claim 9, wherein the detection circuit includes a first clocked device and a second clocked device, wherein the first clocked device is operable to receive the reference signal and generate the first control signal based on transitions of the reference signal, and the second clocked device is operable to receive the feedback signal and generate the second control signal based on transitions of the feedback signal, wherein the reset circuit is operable to generate the reset signal based on transitions of the first control signal, the second control signal, and the feedback signal, wherein the reset circuit is operable to provide the reset signal to the first and second clocked devices to reset the first and second clocked devices.

13. The PLL of claim 9, wherein the reset circuit includes a first NAND gate, a second NAND gate, a third NAND gate, a first AND gate, a first inverter, and a second inverter, wherein the feedback signal is provided to a first input terminal of the first NAND gate, an enable delay signal is provided to a second input terminal of the first NAND gate, and an output terminal of the first NAND gate is coupled to a first input terminal of the second NAND gate, wherein the first control signal is provide to a first input terminal of the first AND gate, the second control signal is provided to a second input terminal of the first AND gate, and an output terminal of the first AND gate is coupled to a second input terminal of the second NAND gate, wherein an enable reset signal is provided to an input terminal of the first inverter, wherein an output terminal of the second NAND gate is coupled to a first input terminal of the third NAND gate and an output terminal of the first inverter is coupled to the second input terminal of the third NAND gate, wherein an output terminal of the third NAND gate is coupled to an input terminal of the second inverter, and an output terminal of the second inverter provides the reset signal to the detection circuit.

14. The PLL of claim 9, configured as a fractional-N PLL.

15. A phase frequency detector comprising:
a detection circuit operable to receive a reference signal and a feedback signal, wherein the detection circuit is operable to generate a first control signal based, at least in part, on the reference signal, and generate a second control signal based, at least in part, on the feedback signal; and a reset circuit operable to generate a reset signal based, at least in part, on the first control signal, the second control signal, and the feedback signal, wherein the reset circuit is operable to provide the reset signal to the detection circuit to reset the detection circuit;

wherein the reset circuit includes a first NAND gate, a second NAND gate, a third NAND gate, a first AND gate, a first inverter, and a second inverter, wherein the feedback signal is provided to a first input terminal of the first NAND gate, an enable delay signal is provided to a second input terminal of the first NAND gate, and an output terminal of the first NAND gate is coupled to a first input terminal of the second NAND gate, wherein the first control signal is provide to a first input terminal of the first AND gate, the second control signal is provided to a second input terminal of the first AND gate, and an output terminal of the first AND gate is coupled to a second input terminal of the second NAND gate, wherein an enable reset signal is provided to an input terminal of the first inverter, wherein an output terminal of the second NAND gate is coupled to a first input terminal of the third NAND gate and an output terminal of the first inverter is coupled to the second input terminal of the third NAND gate, wherein an output terminal of the third NAND gate is coupled to an input terminal of the second inverter, and an output terminal of the second inverter provides the reset signal to the detection circuit.

16. A phase-locked loop (PLL) comprising:

a voltage-controlled oscillator (VCO) operable to generate an output signal of the PLL, wherein the output signal is associated with a feedback signal of the PLL;

a divider coupled to the VCO, wherein the divider is operable to receive the output signal and generate a feedback signal having a pulse width that is approximately equal to a predetermined number of VCO cycles; and a phase frequency detector comprising a detection circuit and a reset circuit;

wherein the detection circuit is operable to receive a reference signal and the feedback signal, wherein the detection circuit is operable to generate a first control signal based, at least in part, on the reference signal, and generate a second control signal based, at least in part, on the feedback signal;

wherein the reset circuit is operable to generate a reset signal based, at least in part, on the first control signal, the second control signal, and the feedback signal, wherein the reset circuit is operable to provide the reset signal to the detection circuit to reset the detection circuit;

wherein the reset circuit includes a first NAND gate, a second NAND gate, a third NAND gate, a first AND gate, a first inverter, and a second inverter, wherein the feedback signal is provided to a first input terminal of the first NAND gate, an enable delay signal is provided to a second input terminal of the first NAND gate, and an output terminal of the first NAND gate is coupled to a first input terminal of the second NAND gate, wherein the first control signal is provide to a first input terminal of the first AND gate, the second control signal is provided to a second input terminal of the first AND gate, and an output terminal of the first AND gate is coupled to a second input terminal of the second NAND gate, wherein an enable reset signal is provided to an input terminal of the first inverter, wherein an output terminal of the second NAND gate is coupled to a first input terminal of the third NAND gate and an output terminal of the first inverter is coupled to the second input terminal of the third NAND gate, wherein an output terminal of the third NAND gate is coupled to an input terminal of the second inverter, and an output terminal of the second inverter provides the reset signal to the detection circuit.

\* \* \* \* \*